(12) United States Patent
Leibfritz et al.

(10) Patent No.: US 8,340,935 B2
(45) Date of Patent: Dec. 25, 2012

(54) 9-TERM CALIBRATION METHOD FOR NETWORK ANALYZERS

(75) Inventors: Martin Leibfritz, Munich (DE); Werner Held, Pocking (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 384 days.

(21) Appl. No.: 12/641,439

(22) Filed: Dec. 18, 2009

(65) Prior Publication Data

US 2010/0161265 A1 Jun. 24, 2010

(30) Foreign Application Priority Data

Dec. 19, 2008 (DE) .......................... 10 2008 063 930
Mar. 20, 2009 (DE) .......................... 10 2009 014 064
Apr. 23, 2009 (DE) .......................... 10 2009 018 703

(51) Int. Cl.
*G01R 11/23* (2006.01)
*G06F 3/00* (2006.01)
*G06F 3/02* (2006.01)
*G06F 3/038* (2006.01)

(52) U.S. Cl. ........... 702/85; 702/115; 702/118; 702/120

(58) Field of Classification Search ............... 702/69, 702/82, 85, 86, 106, 107, 109, 117, 118, 702/179; 324/601; 714/724
See application file for complete search history.

(56) References Cited

U.S. PATENT DOCUMENTS 5,784,299 A * 7/1998 Evers et al. ..................... 702/85
5,793,213 A * 8/1998 Bockelman et al. .......... 324/601
6,300,775 B1 * 10/2001 Peach et al. .................... 324/601
7,107,170 B2    9/2006 Jamneala et al.
7,500,161 B2 * 3/2009 Dunsmore et al. ............ 714/724

FOREIGN PATENT DOCUMENTS

DE         199 18 697 A1   11/1999
DE   10 2005 005 056 A1    3/2006
DE         600 34 121 T2   11/2007

* cited by examiner

*Primary Examiner* — Mohamed Charioui
*Assistant Examiner* — Felix Suarez
(74) *Attorney, Agent, or Firm* — Ditthavong Mori & Steiner, P.C.

(57) ABSTRACT

A network analyzer contains a processing device, at least one signal generator and at least four measuring points. The processing device controls the signal generator and processes measured values picked up from the measuring points. The network analyzer implements several calibration measurements on calibration standards, before it implements measurements on a device under test. The network analyzer implements the calibration measurements using the measuring points. The processing device determines error matrices on the basis of the results of the calibration measurements. The network analyzer implements measurements on the device using simultaneously, exactly three measuring points. The processing device determines measured values in each case of a fourth measuring point on the basis of the calibration measurements and the measured values of the three measuring points. The three measuring points belong to the set of the at least four measuring points, at which the network analyzer implements the calibration measurements.

18 Claims, 4 Drawing Sheets

9-TERM CALIBRATION METHOD FOR NETWORK ANALYZERS

CROSS-REFERENCE TO RELATED APPLICATION

The present application claims priority to German Application No. DE 10 2008 063 930.3, filed on Dec. 19, 2008, German Application No. DE 10 2009 014 064.6, filed on Mar. 20, 2009, and German Application No. DE 10 2009 01 703.0, filed on Apr. 23, 2009, the entire contents of which are herein incorporated by reference.

BACKGROUND OF THE INVENTION

1. Field of the Invention

The invention relates to a network analyzer and a method for the operation of a network analyzer.

2. Discussion of the Background

Often, the 10-term calibration method is used for the calibration of network analyzers. The published German specification DE 199 18 697 A1 discloses a calibration method of this kind. However, it is characterized by a large number of required calibration measurements. The demands on the calibration standards used are also high. Accordingly, only transmissionless calibration standards cannot be used with the conventional 10-term calibration method. Also, only unknown calibration standards cannot be used. Moreover, long-term stable, largely ideal switches for switching between the source port and the load port are required, because the influence of the switches on the calibration cannot be eliminated. However, it is advantageous with the conventional 10-term calibration method, that a very high accuracy of calibration can be achieved with it. It is also advantageous with the conventional 10-term calibration method, that measurements can be implemented on only 3 measuring points at the same time. Accordingly, one measuring point can be omitted.

The published German patent application DE 10 2005 005 056 A1 discloses a further method for the calibration of network analyzers with the 7-term calibration method. By contrast with the 10-term calibration method, the 7-term calibration method requires a smaller number of measurements and allows greater flexibility with regard to the calibration standards used. The partial use of transmissionless calibration standards is also possible. The influence of the switches on the correction calculation continues to be eliminated. Accordingly, non-long-term stable switches can be used. Also, the switches need not provide largely-ideal switching properties. However, it is disadvantageous with the conventional 7-term calibration method that measurements must be implemented simultaneously at 4 measuring points. If a signal is supplied by means of a generator to a source port of the device under test, both the signal emitted by the generator and also the signal reflected from the device under test can be measured without difficulty. The signal passes through the device under test at least partially and is emitted at a terminated load-port end. The emitted signal optionally already provides a significantly lower power, but can still be measured without difficulty. However, the signal reflected at the terminal resistance provides an extremely small power. This leads to a high noise level at the corresponding measuring point. A dynamic loss of the measurements of, for example, 20 dB is the consequence.

SUMMARY OF THE INVENTION

Embodiments of the present invention advantageously provide a network analyzer and a method for the operation of a network analyzer, which allow an accurate and flexible calibration and an accurate measurement.

A network analyzer according to the invention contains a processing device, at least one signal generator and at least four measuring points. The processing device controls the signal generator and processes measured values picked up from the measuring points. The network analyzer implements several calibration measurements on calibration standards, before it implements measurements on a device under test. The network analyzer implements the calibration measurements by means of at least four measuring points. The processing device determines error matrices on the basis of results of the calibration measurements. The network analyzer implements measurements on the device under test simultaneously by means of exactly three measuring points. In each case, the processing device determines measured values of a fourth measuring point on the basis of the results of the calibration measurements and the measured values of the three measuring points. The three measuring points, at which measurements are implemented, belong to the set of the at least four measuring points, at which the network analyzer implements the calibration measurements. Accordingly, a high accuracy of the measurements is achieved. At the same time, flexibility in the type and use of the calibration standards is possible.

During the calibration measurements, the processing device preferably supplies calibration signals to the calibration standards at a first port by means of the signal generator. The network analyzer preferably terminates a second port of the calibration standards during the calibration measurements with low reflection, that is to say, preferably in a reflection-free manner. During the calibration measurements, the processing device advantageously supplies calibration signals to the calibration standards at the second port by means of the signal generator. By preference, the network analyzer terminates the first port of the calibration standards during the calibration measurements with low reflection, that is to say, preferably in a reflection-free manner. Accordingly, accurate, direction-independent measured values are achieved.

By preference, during the calibration measurements, the processing device measures the incoming and outgoing waves at the first and second port of the calibration standards by means of the four measuring points. Accordingly, complete measured values are achieved without the need for a reconfiguration of the test setup.

During the calibration measurements, the processing device advantageously determines the relationships $(x_{Li}=mb_i/ma_i)$ of incoming waves $(ma_i)$ and outgoing waves $(mb_i)$ at a port of the calibration standards terminated respectively with low reflection. Accordingly, parameters are determined, which render unnecessary an implementation of measurements on the device under test at four measuring points.

By preference, the network analyzer contains switches, by means of which ports of the device under test are connected. The switches preferably switch between a low-reflection termination and a supply of a test signal to the port. The processing device preferably controls the switches. The switches are preferably long-term stable and largely frequency independent. Accordingly, accurate measured results are obtained.

The network analyzer, preferably contains a signal generator for every port of the device under test. Particularly accurate measured results can be obtained in this manner.

BRIEF DESCRIPTION OF THE DRAWINGS

The invention is described by way of example below with reference to the drawings, in which an advantageous exemplary embodiment of the invention is presented. The drawings are as follows.

DETAILED DESCRIPTION OF EXEMPLARY EMBODIMENTS OF THE INVENTION

The basic function of a calibration measurement and the parameters will first be explained with reference to FIG. 1. The structure and functioning of the network analyzer according to the invention are visualized by means of FIGS. 2-5. The functioning of the method according to the invention is then illustrated with reference to FIG. 6. A repetition of the presentation and description of identical elements in similar diagrams has not been provided in some cases.

Figure 1:
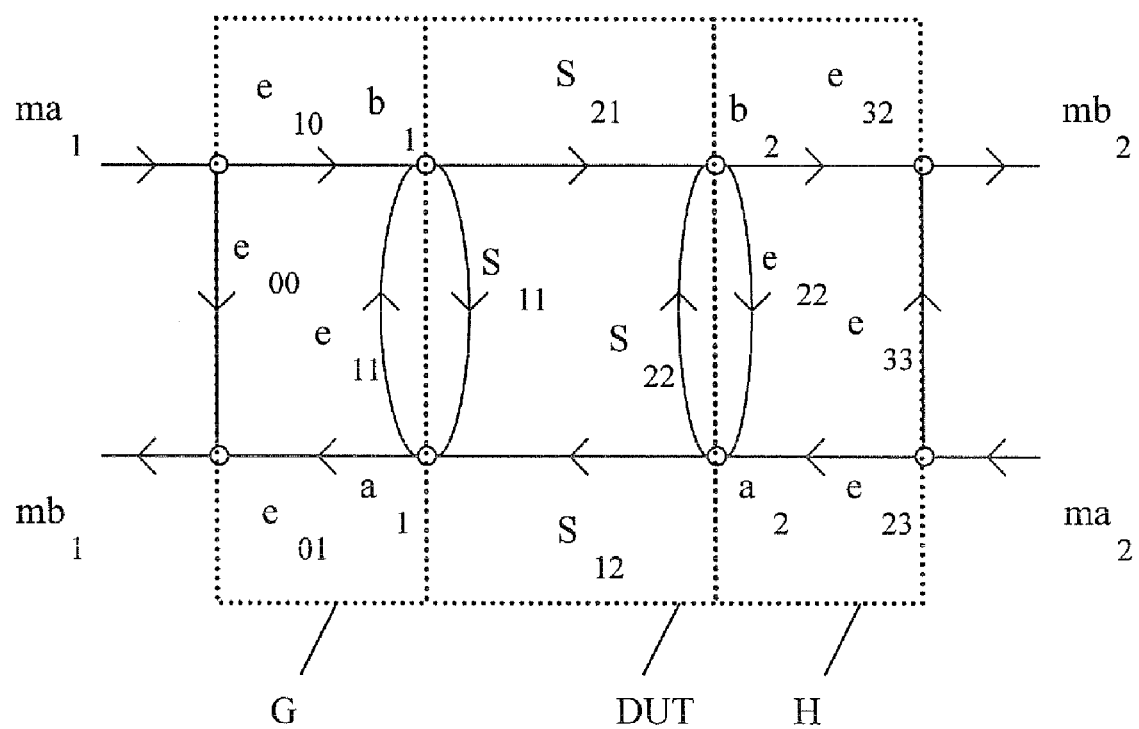
FIG. 1 shows an overview of the parameters of a measurement of a network analyzer.

FIG. 1 gives an overview of the parameters of a measurement of a network analyzer. The network analyzer is preferably a vectorial network analyzer. A device under test or a calibration standard can be connected by means of the terminals $a_1$, $b_1$ $a_2$, $b_2$ to a measuring device. Non-ideal components of the measuring device and supply lines are disposed between the terminals of the measuring device, which is assumed to be ideal, and the terminals $a_1$, $b_1$ $a_2$, $b_2$ of the device under test or calibration standard. These are modelled by means of two error two-ports or error matrices G, H. The device under test or the calibration standard is modelled by means of the matrix $S_{DUT}$. In this context, the error two-port G contains the parameters $e_{10}$, $e_{01}$ $e_{00}$, and $e_{11}$. The error two-port H contains the parameters $e_{32}$, $e_{23}$ $e_{33}$, and $e_{22}$. The matrix $S_{DUT}$ contains the parameters $S_{21}$, $S_{12}$ $S_{22}$, and $S_{11}$. The waves $ma_1$, $mb_1$, $ma_2$, $mb_2$ are transmitted and/or received from the ideal measuring device.

The parameters of the error two-ports are unknown and cannot be measured directly. Accordingly, the majority of calibration measurements are implemented on known and/or unknown calibration standards. The error two-ports are determined on the basis of the results of these calibration measurements. Only then is the device under test connected. This will be explained in greater detail with reference to FIGS. 2-5.

The following procedure is adopted for the calculation of the error two-ports:

The following applies for the source port:

$$\begin{pmatrix} b_1 \\ a_1 \end{pmatrix} = \underbrace{\begin{pmatrix} g_{11} & g_{12} \\ g_{21} & g_{22} \end{pmatrix}}_{G} \cdot \begin{pmatrix} ma_1 \\ mb_1 \end{pmatrix}$$

The following applies for the load port:

$$\begin{pmatrix} a_2 \\ b_2 \end{pmatrix} = \underbrace{\begin{pmatrix} h_{11} & h_{12} \\ h_{21} & h_{22} \end{pmatrix}}_{H} \cdot \begin{pmatrix} mb_2 \\ ma_2 \end{pmatrix}$$

For the device under test, the following applies in general:

$$\begin{pmatrix} b_1 \\ b_2 \end{pmatrix} = \underbrace{\begin{pmatrix} S_{11} & S_{12} \\ S_{21} & S_{22} \end{pmatrix}}_{S} \cdot \begin{pmatrix} a_1 \\ a_2 \end{pmatrix}$$

Accordingly, the following dependencies upon the measuring points are obtained:

$$\underbrace{\begin{pmatrix} g_{11}ma_{11} + g_{12}mb_{11} & g_{11}ma_{12} + g_{12}mb_{12} \\ h_{21}mb_{21} + h_{22} + ma_{21} & h_{21}mb_{22} + h_{22}ma_{22} \end{pmatrix}}_{M_1} =$$

$$\underbrace{\begin{pmatrix} S_{11} & S_{12} \\ S_{21} & S_{22} \end{pmatrix}}_{S_{OUT}} \underbrace{\begin{pmatrix} g_{21}ma_{11} + g_{22}mb_{11} & g_{21}ma_{12} + g_{22}mb_{12} \\ h_{11}mb_{21} + h_{12}ma_{21} & h_{11}mb_{22} + h_{12}ma_{22} \end{pmatrix}}_{M_2}$$

In this context, the first index refers to the respective wave magnitude. The second index refers to the currently driving port ($ma_{12}$: wave magnitude $ma_1$ when port 2 is driving). The corrected scatter parameters of the device under test can then be calculated using a matrix inversion and matrix multiplication:

$$S_{DUT} = M_1 M_2^{-1} \qquad (A)$$

The pre-requisite for this is that the matrix entries $g_{ij}$ and $h_{ij}$ are known. However, these can be determined directly from the error terms. Furthermore, the matrix $M_2$ must be invertible.

The following section explains the determination of $g_{ij}$ and $h_{ij}$ from the error terms.

For the source port, the following is obtained:

$$a_1 = ma_1 e_{10} + b_1 e_{11}$$

$$mb_1 = ma_1 e_{00} + b_1 e_{01} \qquad (1.1)$$

Accordingly, the following is obtained:

$$\begin{pmatrix} b_1 \\ a_1 \end{pmatrix} = \underbrace{\begin{pmatrix} g_{11} & g_{12} \\ g_{21} & g_{22} \end{pmatrix}}_{G} \cdot \begin{pmatrix} ma_1 \\ mb_1 \end{pmatrix} \Rightarrow \begin{matrix} b_1 = g_{11}ma_1 + g_{12}mb_1 \\ a_1 = g_{21}ma_1 + g_{22}mb_1 \end{matrix} \qquad (1.2)$$

By extraction of $b_1$ from (1.1), the following is obtained:

$$b_1 = (mb_1 - ma_1 e_{00}) \frac{1}{e_{01}} \qquad (1.3)$$

Through coefficient comparison of (1.3) and (1.2), the following is obtained:

$$g_{12} = \frac{1}{e_{01}} \text{ und } g_{11} = -\frac{e_{00}}{e_{01}} \quad (1.4)$$

By inserting (1.3) into (1.1), the following is obtained:

$$a_1 = e_{10}ma_1 + \frac{e_{11}}{e_{01}}(mb_1 - ma_1 e_{00}) \quad (1.5)$$

Through coefficient comparison of (1.5) and (1.2), the following is obtained:

$$g_{21} = e_{10} - \frac{e_{00}e_{11}}{e_{01}} \text{ und } g_{22} = \frac{e_{11}}{e_{01}} \quad (1.6)$$

Correspondingly, for the load port, the following is obtained:

$$a_2 = b_2 e_{22} + ma_2 e_{23}$$

$$mb_2 = b_2 e_{32} + ma_2 e_{33} \quad (1.7)$$

Accordingly, the following is obtained:

$$\begin{pmatrix} a_2 \\ b_2 \end{pmatrix} = \underbrace{\begin{pmatrix} h_{11} & h_{12} \\ h_{21} & h_{22} \end{pmatrix}}_{H} \cdot \begin{pmatrix} mb_2 \\ ma_2 \end{pmatrix} \Rightarrow \begin{array}{l} a_2 = h_{11}mb_2 + h_{12}ma_2 \\ b_2 = h_{21}mb_2 + h_{22}ma_2 \end{array} \quad (1.8)$$

Through extraction of $b_2$ from (1.7), the following is obtained:

$$b_2 = (mb_2 - ma_2 e_{33})\frac{1}{e_{32}} \quad (1.9)$$

The coefficient comparison of (1.9) and (1.8), therefore leads to the following:

$$h_{21} = \frac{1}{e_{32}} \text{ und } h_{22} = -\frac{e_{33}}{e_{32}} \quad (1.10)$$

An insertion of (1.10) into (1.7) leads to the following:

$$a_2 = (mb_2 - ma_2 e_{33})\frac{e_{22}}{e_{32}} + ma_2 e_{23} \quad (1.11)$$

A coefficient comparison of (1.11) and (1.8) leads to the following:

$$h_{11} = \frac{e_{22}}{e_{32}} \text{ und } h_{12} = e_{23} - \frac{e_{22}e_{33}}{e_{32}} \quad (1.12)$$

Figure 2:
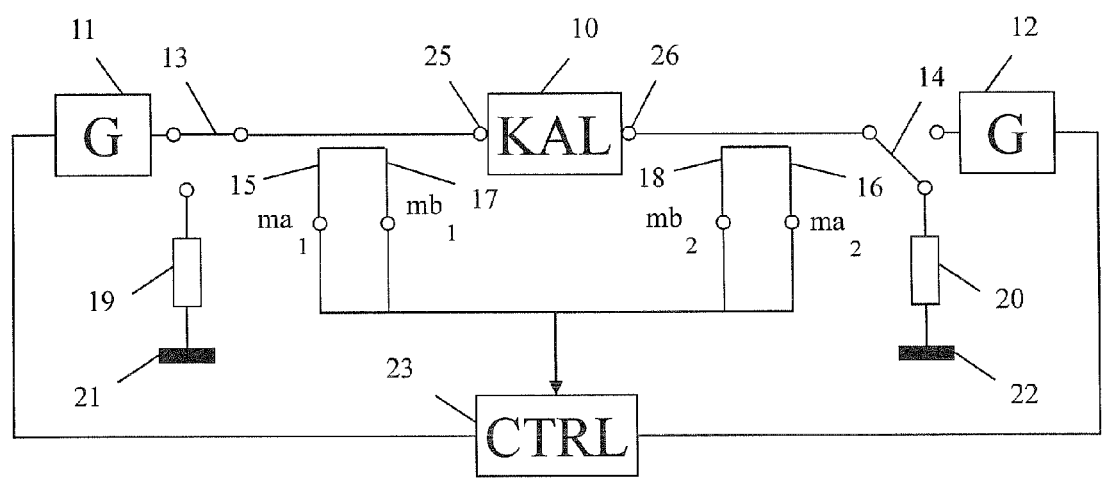
FIG. 2 shows an exemplary embodiment of the network analyzer according to the invention in a first functional condition.

FIG. 2 shows an exemplary embodiment of the network analyzer according to the invention in a first functional condition. The network analyzer contains a processing device 23, two signal generators 11, 12, four measuring points 15, 16, 17, 18 and two switches 13, 14. The measuring points 15, 16, 17, 18 in this context are designed as directional couplers. The measuring points 15, 16, 17, 18, the switches 13, 14 and the signal generators 11, 12 are connected to the processing device 23. The processing device 23 controls the signal generators 11, 12, the switches 13, 14 and receives the measured values from the measuring points 15, 16, 17, 18.

Furthermore, the processing device 23 implements a re-processing of the signals. In particular, the processing device 23 advantageously contains mixers, which transform the received signal is into a digitally-processable frequency range. Furthermore, the processing device 23 controls display devices, which are not illustrated. Calibration measurements and the calibration calculations are also implemented by the processing device 23. Instead of respectively one signal generator per port of the device under test, the network analyzer can also contain only one signal generator, which is switched between the ports by means of the switches.

FIG. 2 presents a first calibration measurement. A calibration standard 10 is connected to the signal generator 11 by means of the switch 13 and by means of the port 25. The second port 26 of the calibration standard 10 is connected by means of the second switch 14 via a load resistance 20 to an earth terminal 22. In this context, the load resistance 20 is designed in such a manner that it represents a low-reflection termination. The load resistance 20 can contain ohmic, capacitive and inductive components. Conventionally, within the framework of a calibration, at least one non-transmissive and one transmissive calibration standard are used. Different combinations of transmissive and non-transmissive calibration standards are therefore possible. A calibration with several transmissive standards is also possible. The calibration standard 10 used here is transmissive. That is to say, part of the signal supplied at the source port 25 is released again at the load port 26.

During the calibration measurement, a signal is generated by the signal generator 11 and transmitted via the switch 13 to the calibration standard 10. The signal passes through the transmissive calibration standard 10 and is removed to earth 22 via the load resistor 20. In this context, the wave $ma_1$ emitted by the signal generator 11 is picked up by the measuring point 15. The wave $mb_1$ reflected from the calibration standard 10 is picked up by the measuring point 17. The wave $mb_2$ transmitted from the calibration standard 10 is picked up by the measuring point 18. The wave $ma_2$ reflected from the load resistance 20 is picked up by the measuring point 16. The measuring points 15, 16, 17, 18 transmit the signals to the processing device 23, which measures the signals picked up. This measurement is implemented for a plurality of frequencies. The results of this first calibration measurement are stored by the processing device 23. Alongside this calibration measurement, in at least one transmissive calibration standard, further calibration measurements are implemented on transmissive and/or non-transmissive calibration standards.

Figure 3:
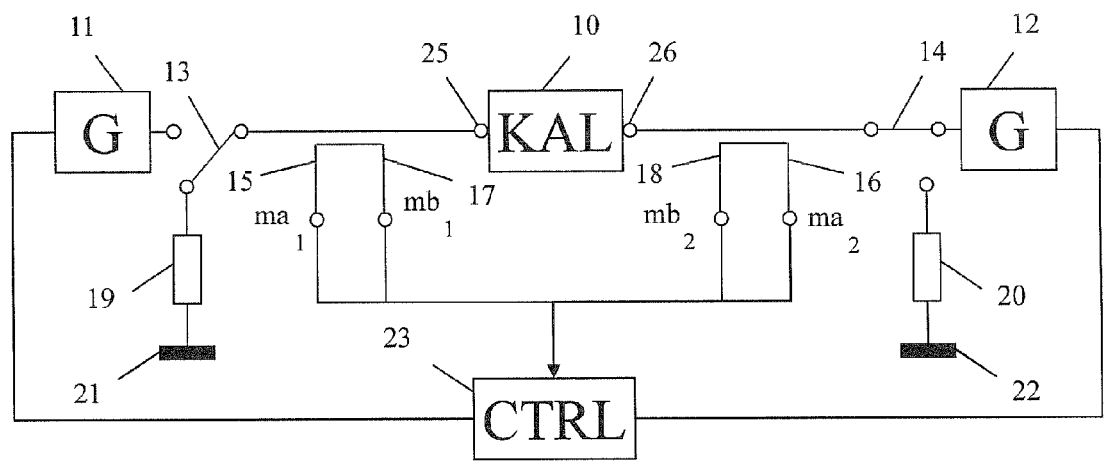
FIG. 3 shows the exemplary embodiment of the network analyzer according to the invention in a second functional condition.

FIG. 3 illustrates the exemplary embodiment of the network analyzer according to the invention in a second functional condition. Here, a second calibration measurement of the identical calibration standard 10 from FIG. 2 is presented. However, the direction of flow of the signals through the calibration standard 10 is reversed here. The processing device 23 now controls the signal generator 12 and the switches 13, 14 in such a manner that the signal generator 12 transmits a signal by means of the switch 14 and the port 26 to the calibration standard, and the signal is transmitted by means of the switch 13 and the port 25 via the load resistance 19 to the earth terminal 21. The load resistance 19 also represents a low-reflection termination here. In this context, the wave $ma_2$ emitted by the signal generator 12 is picked up by means of the measuring point 16. The wave $mb_2$ reflected from the calibration standard 10 is picked up by the test point 18. The wave $mb_1$ transmitted by the calibration standard 10 is picked up by the measuring point 17. The wave $ma_1$ reflected from the load resistance 20 is picked up by the measuring point 15.

The measuring points 15, 16, 17, 18 once again transmit the signals to the processing device 23, which measures the signals picked up. This measurement is also implemented for a plurality of frequencies. The results of this first calibration measurement are stored by the processing device 23.

The calibration measurements presented with reference to FIG. 2 and FIG. 3 are repeated for several known and/or unknown calibration standards. In this context, the further calibration standards need not provide transmissive properties. A calibration measurement on a single transmissive calibration standard already provides the necessary wave magnitudes to allow one measuring point to be dispensed with in the measurement of the device under test.

From the measured values obtained in this manner, the processing device 23, determines the parameters of the error two-ports G, H from FIG. 1 as presented with reference to the formulae 1.1 to 1.12, for example, using the 7-term method; the calculation of the error terms from the measured wave magnitudes is not explained here in greater detail to avoid repetition—it corresponds to the standard procedure, for example, within the framework of a use of the 7-term method. Furthermore, with reference to the waves $mb_2$, $mb_1$ transmitted respectively from the transmissive calibration standard 10 and the waves $ma_2$, $ma_1$ reflected on the load resistance 19, 20, the processing device 23 determines relationships of the waves $x_{L1}=mb_1/ma_1$, $x_{L2}=mb_2/ma_2$ at the respective ports 25, 26. These relationships $x_{L1}$, $x_{L2}$ are independent of the calibration standards. They are dependent only upon the configuration of the respective measuring points and supply lines. These relationships $x_{L1}$, $x_{L2}$ are also stored by the processing device 23.

Figure 4:
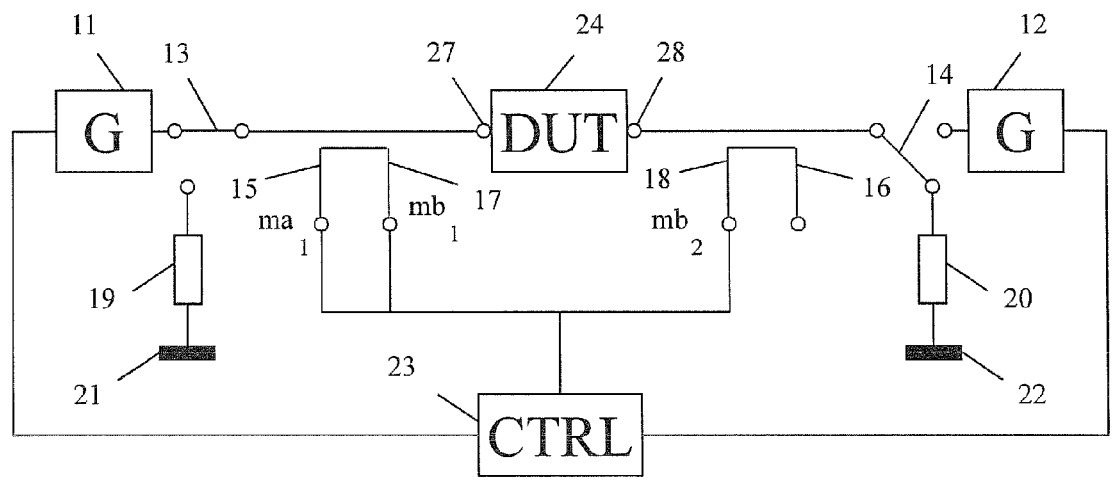
FIG. 4 shows the exemplary embodiment of the network analyzer according to the invention in a third functional condition.

FIG. 4 shows the exemplary embodiment of the network analyzer according to the invention in a third functional condition. Here, the implementation of a first measurement on a device under test 24 is shown. The signal is transmitted from the signal generator 11 by means of the switch 13 and the port 27 to the device under test 24. After passing through the device under test 24, it is output at the port 28 and transmitted via the switch 14 and the load resistance 20 to the earth terminal 22. The configuration of the other components here corresponds to the configuration from FIG. 2. However, no waves $ma_2$ reflected from the load resistance 20 are picked up, processed and stored. Instead, the value $ma_2$ is determined from the wave $mb_2$ transmitted from the device under test 24 and the relationship $x_{L2}=mb_2/ma_2$ determined within the framework of the calibration measurements. Accordingly, the value $ma_2$ is obtained as $ma_2=mb_2/x_{L2}$.

Figure 5:
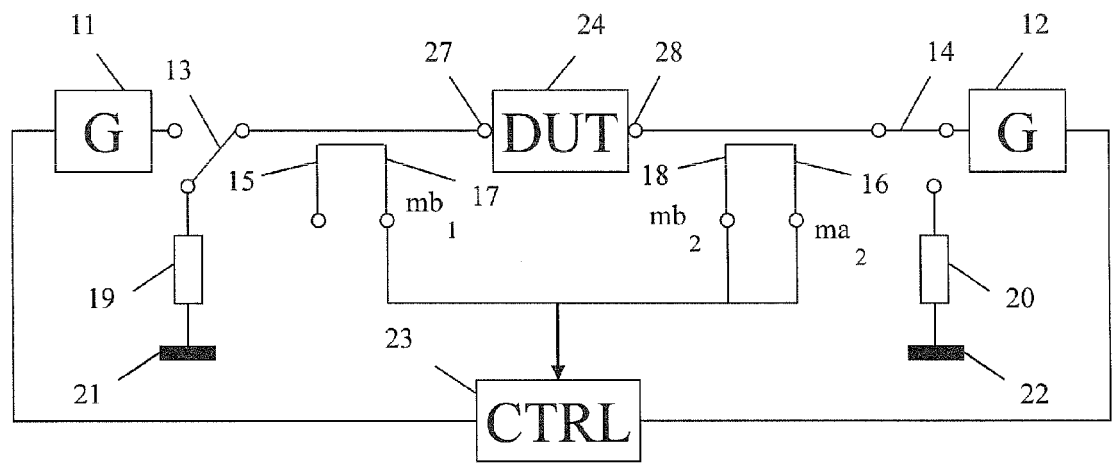
FIG. 5 shows the exemplary embodiment of the network analyzer according to the invention in a fourth functional condition.

In FIG. 5, the exemplary embodiment of the network analyzer according to the invention is presented in a fourth functional condition. Here, the implementation of a second measurement on a device under test 24 is shown. The signal is transmitted from the signal generator 12 by means of the switch 14 and the port 28 to the device under test 24. After passing through the device under test 24, it is output at the port 27 and transmitted via the switch 13 and the load resistance 19 to the earth terminal 21. The configuration of the other components here corresponds to the configuration from FIG. 3. None of the waves $ma_1$ reflected from the load resistance 19 are picked up, processed and stored. Instead, the value $ma_1$ is determined from the waves $mb_1$ transmitted by the device under test 24 and the ratio $x_{L1}=mb_1/ma_1$ determined within the framework of the calibration measurements. Accordingly, the value $ma_1$ is obtained as $ma_1=mb_1/x_{L1}$.

Finally, on the basis of the implemented measurements on the device under test 24, the values determined on the basis of the relationships $x_{L2}$ and $x_{L1}$ and the determined error two-ports G and H, the parameters of the device under test 24 are determined by means of a conventional error correction, for example, on the basis of formula A. This is explained in greater detail in the section relating to FIG. 1.

Figure 6:
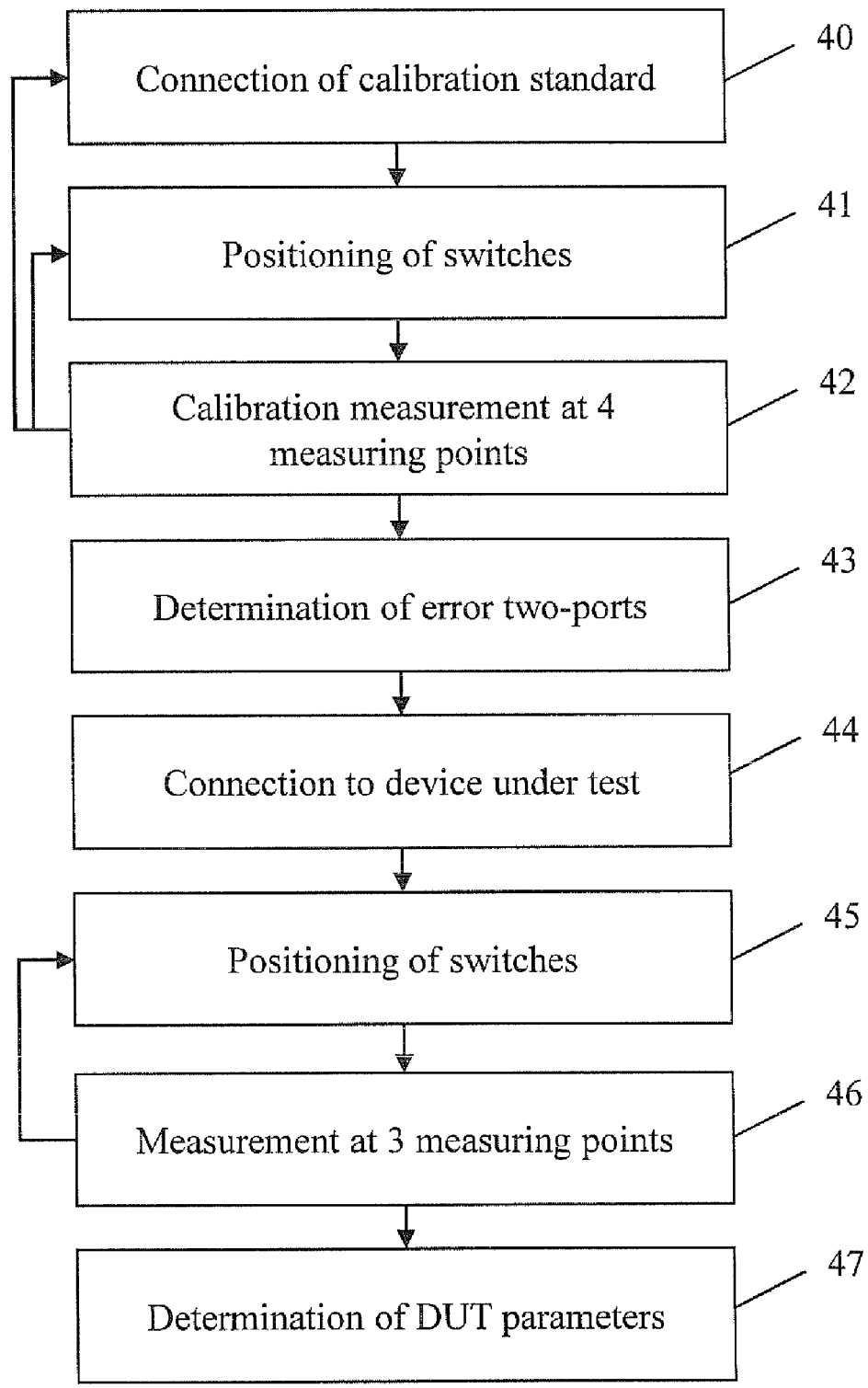
FIG. 6 shows an exemplary embodiment of the method according to the invention.

FIG. 6 shows an exemplary embodiment of the method according to the invention. In the first step 40, a calibration standard is connected to the network analyzer. In the second step 41, the internal configuration of the network analyzer is adjusted. That is to say, a signal generator and a load are connected to the ports of the calibration standard.

In a third step 42, a calibration measurement is implemented on the connected calibration standard. In this context, a signal is supplied to the calibration standard. The signal passes through the transmissive calibration standard and is removed via a load resistance to an earth terminal. The load resistance in this context is designed as a low-reflection terminal. The calibration standard can also be a non-transmitting calibration standard. That is to say, in this case, no signal is transmitted through the calibration standard and removed to earth. The calibration standard can be a calibration standard with known or unknown parameters. This step contains measurements with at least one signal of a given frequency. In order to increase the accuracy of the calibration, however, several measurements are implemented with different frequencies. In the case of the calibration measurement, incoming waves $ma_1$, $ma_2$ and outgoing waves $mb_1$, $mb_2$ are measured at all of the ports of the calibration standard. That is to say, in the case of a calibration standard with 2 ports, calibration measurements are implemented at 4 measuring points.

The second step 41 and the third step 42 are repeated for different signal directions. That is to say, all signal directions are adjusted one after the other. The first three steps 40 to 42 are repeated in this context for a plurality of different calibration standards. At least one of the calibration standards used provides transmissive properties. Conventionally, one transmissive calibration standard and several non-transmissive calibration standards are used. The use of several transmissive calibration standards is also possible. In the case of the calibration measurements, each port of the transmissive calibration standard/s is operated both as a source port and also as a load port. In the case of non-transmissive calibration standards, every port is operated as a source port.

Within the framework of the calibration measurements, the relationships $x_{L1}$, $x_{L2}$ of the incoming waves $ma_1$, $ma_2$ and outgoing waves $mb_1$, $mb_2$ are further determined at the load ports, if a transmissive calibration standard is used. That is to say, the relationships are obtained as $x_{L2}=mb_2/ma_2$, $x_{L1}=mb_1/ma_1$. In a fourth step 43, starting from the results of the calibration measurements, the error two-ports G, H are determined using, for example, the 7-term method and as shown with reference to the formulae 1.1 to 1.12.

In a fifth step 44, a device under test is connected to the network analyzer. In a sixth step 45, the internal configuration of the network analyzer is adjusted, that is to say, a signal generator and a load are connected to the ports of the device under test. In a seventh step 46, a measurement is implemented on the connected device under test. In this context, a signal is supplied to the device under test. The signal passes through the device under test and is removed via a load resistance to an earth terminal. The earth terminal here is designed as a low-reflection termination. Single-port devices under test are also possible. This step contains measurements with at least one signal of one frequency. In order to obtain information about the behaviour of the device under test within a frequency range, several measurements with different frequencies are preferably implemented.

In the measurement, incoming waves $ma_1$ and respectively $ma_2$ and outgoing waves $mb_1$ and respectively $mb_2$ are measured at the source port, that is to say, at the port, at which the signal generator is connected. At the load port, only the outgoing wave $mb_1$ and respectively $mb_2$ is measured. That is to say, the wave $ma_1$ and respectively $ma_2$ reflected from the load resistance is not measured. The first named values in this context are related to a terminal of the signal generator at the first port. The second named values are related to a terminal of the signal generator at the second port. That is to say, with a device under test with 2 ports, measurements are implemented at 3 measuring points. The three measuring points are contained within the set of four measuring points, at which the calibration measurements were implemented.

The sixth step 45 and seventh step 46 are repeated for all signal directions.

In an eighth step 47, the parameters of the device under test are finally determined. For this purpose, initially on the basis of the relationships determined in the fourth step 43 and the measured values determined in the seventh step 46, the missing values of the fourth measuring point in each case are determined. These are obtained as $ma_1=mb_1/x_{L1}$ and $ma_2=mb_2/x_{L2}$. On the basis of the measured values determined in the seventh step 46, the values determined in this step and on the basis of the error two-ports, a conventional error correction is implemented according to the 7-term method. That is to say, the influence of the error two-ports is calculated from the measured values or the determined values. There remains the pure scattering matrix of the device under test. This has already been explained in greater detail.

The invention is not restricted to the exemplary embodiment presented. As already mentioned, network analyzers with different numbers of measuring points can be used. A use of devices under test with more than two ports is also possible. All of the features described above or illustrated in the diagrams can be advantageously combined with one another as required within the framework of the invention.

| Key to diagrams | |
|---|---|
| 40 | Connection of calibration standard |
| 41 | Positioning of switches |
| 42 | Calibration measurement at 4 measuring points |
| 43 | Determination of error two-ports |
| 44 | Connection to device under test |
| 45 | Positioning of switches |
| 46 | Measurement at 3 measuring points |
| 47 | Determination of DUT parameters |

The invention claimed is:

1. A method for operating a network analyzer with at least four measuring points, comprising:
   implementing a plurality of calibration measurements with calibration standards, using the at least four measuring points, prior to implementing measurements on a device under test,
   determining, via at least one processor, error matrices based on the results of the calibration measurements,
   implementing measurements on the device under test using, simultaneously, exactly three measuring points,
   determining, via the at least one processor, the measured values in each case of a fourth measuring point based on the results of the calibration measurements and the measured values of the three measuring points,
   wherein the three measuring points, at which measurements are implemented, belong to the set of the at least four measuring points, at which the calibration measurements are implemented; and
   terminating ports of the device under test using switches that are switched between a low-reflection termination and a supply of a test signal to the port,
   wherein the switches are long-term stable and substantially frequency independent.

2. The method according to claim 1, further comprising:
   supplying calibration signals, during the calibration measurements, to the calibration standards at a first port, and
   terminating, during the calibration measurements, a second port of the calibration standards with low reflection.

3. The method according to claim 2, further comprising:
   supplying, during the calibration measurements, calibration signals to the calibration standards at the second port, and
   terminating, during the calibration measurements, the first port of the calibration standards with low reflection.

4. The method according to claim 1, further comprising:
   measuring incoming waves and outgoing waves, during the calibration measurements, at the first port and the second port of the calibration standards.

5. The method according to claim 1, further comprising:
   determining, via the at least one processor, during the calibration measurements, the relationships ($x_{L1}=mb_1/ma_1$, $x_{L2}=mb_2/ma_2$) of incoming waves ($ma_1$, $ma_2$) and outgoing waves ($mb_1$, $mb_2$) in each case at a port of the calibration standards terminated with low reflection.

6. The method according to claim 2, further comprising:
   measuring, during the calibration measurements, the incoming waves and the outgoing waves at the first port and the second port of the calibration standards.

7. The method according to claim 2, further comprising:
   determining, via the at least one processor, during the calibration measurements, the relationships ($x_{L1}=mb_1/ma_1$, $x_{L2}=mb_2/ma_2$) of incoming waves ($ma_1$, $ma_2$) and outgoing waves ($mb_1$, $mb_2$) in each case at a port of the calibration standards terminated with low reflection.

8. The method according to claim 2, further comprising:
   terminating ports of the device under test using switches, and
   switching the switches between a low-reflection termination and a supply of a test signal to the port,
   wherein the switches are long-term stable and substantially frequency independent.

9. A network analyzer comprising at least one processing device, at least one signal generator and at least four measuring points, wherein the at least one processing device is configured to perform:
   controlling the signal generator and processing measured values picked up from the measuring points,
   implementing a plurality of calibration measurements with calibration standards, using the at least four measuring points, prior to implementing measurements on the device under test,
   determining error matrices based on results of the calibration measurements,
   implementing measurements on the device under test using, simultaneously, exactly three measuring points, determining measured values in each case of a fourth measuring point based on the calibration measurements and measured values of the three measuring points, wherein the three measuring points, at which measurements are implemented, belong to the set of the at least four measuring points, at which the calibration measurements are implemented, and controlling switches that are switched between a low-reflection termination and a supply of a test signal at ports of the device under test, wherein the switches are long-term stable and substantially frequency independent.

10. The network analyzer according to claim 9, wherein the processing device is further configured to perform:

supplying, during the calibration measurements, calibration signals to the calibration standards at a first port using the signal generator, and terminating, during the calibration measurements, a second port of the calibration standards with low reflection.

11. The network analyzer according to claim 10, wherein the processing device is further configured to perform:

supplying, during the calibration measurements, calibration signals to the calibration standards at the second port using the signal generator, and terminating, during the calibration measurements, the first port of the calibration standards with low reflection.

12. The network analyzer according to claim 9, wherein the processing device is further configured to perform:

measuring, during the calibration measurement, the incoming waves and the outgoing waves at the first port and the second port of the calibration standards using the four measuring points.

13. The network analyzer according to claim 9, wherein the processing device is further configured to perform:

determining, during the calibration measurements, the relationships ($x_{L1}=mb_1/ma_1$, $x_{L2}=mb_2/ma_2$) of incoming waves ($ma_1$, $ma_2$) and outgoing waves ($mb_1$, $mb_2$) in each case at a port of the calibration standards terminated with low reflection.

14. The network analyzer according to claim 9, wherein the network analyzer contains a signal generator for each port of the device under test.

15. The network analyzer according to claim 10, wherein, during the calibration measurement, the processing device, measures the incoming waves and the outgoing waves at the first port and the second port of the calibration standards using the four measuring points.

16. The network analyzer according to claim 10, wherein the processing device is further configured to perform:

determining, during the calibration measurements, the relationships ($x_{L1}=mb_1/ma_1$, $x_{L2}=mb_2/ma_2$) of incoming waves ($ma_1$, $ma_2$) and outgoing waves ($mb_1$, $mb_2$) in each case at a port of the calibration standards terminated with low reflection.

17. The network analyzer according to claim 10, wherein the processing device is further configured to perform:

terminating ports of the device under test using switches, and switching the switches between a low-reflection termination and a supply of a test signal to the port, wherein the switches are long-term stable and largely frequency independent.

18. The network analyzer according to claim 10, wherein the network analyzer contains a signal generator for each port of the device under test.

* * * * *